US012683615B2

(12) United States Patent　　　　(10) Patent No.:　US 12,683,615 B2
Salvia et al.　　　　　　　　　　　(45) Date of Patent:　　Jul. 14, 2026

(54) TUNABLE DIGITALLY CONTROLLED OSCILLATOR

(71) Applicant: Google LLC, Mountain View, CA (US)

(72) Inventors: James Christian Salvia, Belmont, CA (US); Meisam Heidarpour Roshan, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 8 days.

(21) Appl. No.: 18/735,457

(22) Filed: Jun. 6, 2024

(65) Prior Publication Data

US 2025/0379585 A1　　Dec. 11, 2025

(51) Int. Cl.
　　*H03L 7/099*　　　(2006.01)
　　*H03L 7/081*　　　(2006.01)
(52) U.S. Cl.
　　CPC .......... *H03L 7/0991* (2013.01); *H03L 7/0814* (2013.01)
(58) Field of Classification Search
　　CPC ....... H03L 7/0991; H03L 7/0814; H03K 5/14; H03K 5/134
　　See application file for complete search history.

(56) References Cited

U.S. PATENT DOCUMENTS

| | | | | |
|---|---|---|---|---|
| 7,102,449 | B1 * | 9/2006 | Mohan ................. | H03K 3/0322 327/57 |
| 2008/0111641 | A1 * | 5/2008 | Huang ................. | H03L 7/0991 257/E29.345 |

| | | | | |
|---|---|---|---|---|
| 2009/0147902 | A1 | 6/2009 | Liu et al. | |
| 2012/0081157 | A1 | 4/2012 | Greenhill et al. | |
| 2016/0149564 | A1 * | 5/2016 | Huang ................... | H03K 5/134 327/277 |
| 2016/0164529 | A1 | 6/2016 | Nakamura et al. | |

OTHER PUBLICATIONS

Choong et al., "Digital controlled oscillator (DCO) for all digital phase-locked loop (ADPLL)—a review," Jurnal Teknologi (Sciences & Engineering), Dec. 25, 2019, 82:1, 29-40.
Konstadinidis et al., "SPARC M7: A 20 nm 32-Core 64 MB L3 Cache Processor," IEEE Journal of Solid-State Circuits, Jan. 2016, 51(1):79-91.
Mair et al., "2.5 A 7nm FinFET 2.5GHz/2.0GHz Dual-Gear Octa-Core CPU Subsystem with Power/Performance Enhancements for a Fully Integrated 5G Smartphone SoC," IEEE International Solid-State Circuits Conference, San Francisco, CA, Feb. 16-20, 2020, 3 pages.
Tomar et al., "Design of 1.1 GHz Highly Linear Digitally-Controlled Ring Oscillator with Wide Tuning Range," IEEE International Workshop on Radio-Frequency Integration Technology, Singapore, Singapore, Dec. 9-11, 2007, pp. 82-85.

* cited by examiner

*Primary Examiner* — Daniel C Puentes
(74) *Attorney, Agent, or Firm* — Fish & Richardson P.C.

(57)　　　　　ABSTRACT

Systems and methods for a tunable digitally controlled oscillator. In one aspect, an apparatus includes one or more lattices of delay stages. Multiple, different paths may be selected through the lattices. Each path begins at a first delay stage with an input connected to a signal input node and ends at a second delay stage with an output connected to a signal output node.

17 Claims, 6 Drawing Sheets

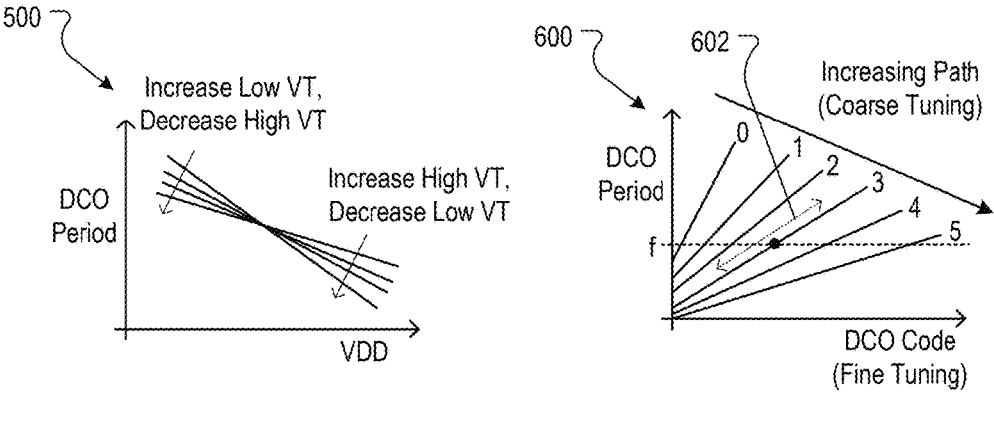
FIG. 5　　　　　　　FIG. 6
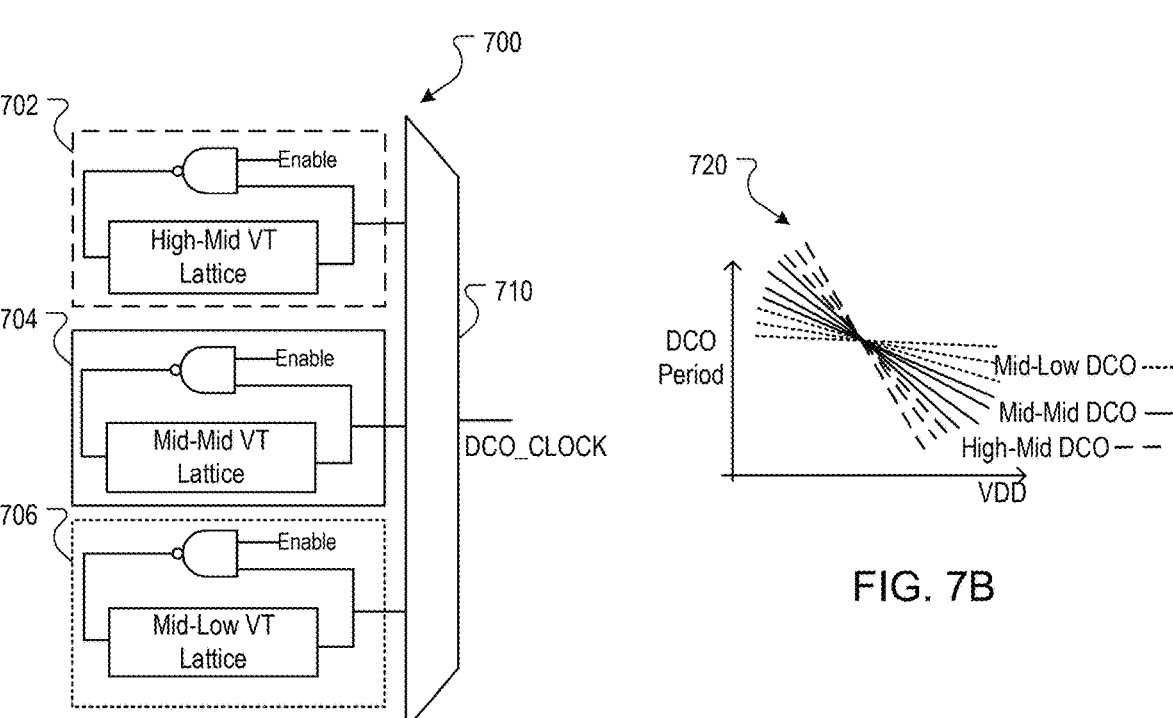
FIG. 7A
FIG. 7B

TUNABLE DIGITALLY CONTROLLED OSCILLATOR

BACKGROUND

Oscillators are used to generate clock signals for integrated circuits. When integrated circuits undergo sudden changes in workload, off-chip voltage regulation and power delivery networks experience abrupt changes in current draw. Parasitic inductance in these networks can create large undershoots and ringing on the supply voltage in response to these changes. Such transients are referred to as L*di/dt events. To avoid timing errors during these events, a voltage margin on top of integrated circuit nominal supply voltage VDD may be required. However, the voltage margins necessary to guarantee timing during these uncommon, brief L*di/dt events incur significant power penalties during normal operation.

The adaptive clock from a frequency locked loop (FLL) can be used in place of a traditional fixed-frequency clock source like a phase locked loop (PLL) to slow down the clock in response to L*di/dt events, thereby reducing the voltage margins required to avoid timing errors. Other techniques for adjusting the clock like droop detection, frequency division, and cycle skipping can be limited by reaction latency. These other techniques, however, can also create or exacerbate L*di/dt events.

SUMMARY

This specification describes technologies relating to tunable digitally controlled oscillators (DCO), and in particular to a DCO that allows for a wide programmable range as well as a programmable voltage sensitivity.

In general, one innovative aspect of the subject matter described in this specification can be embodied in an apparatus that includes a first signal input node, a first signal output node, and a plurality of delay stages arranged in a first lattice. Each delay stage is operable to receive a signal as input and generate a delayed instance of the signal as output. The delay stages are connected to each other in the first lattice to define a plurality of sequential ordinal paths, and each sequential ordinal path comprises a unique proper subset of the plurality of delay stages. Each sequential ordinal path subsequent to a prior sequential ordinal path includes in its unique proper subset of delay stages at least a delay stage from each prior ordinal path. Each sequential ordinal path includes a plurality of delay stages, and each sequential ordinal path begins at a first delay stage with an input connected to the first signal input node and ends at a second delay stage with an output connected to the first signal output node. The delay stages are operable to receive first control data defining a selected path and the control data causes each delay stage to selectively activate or deactivate to select one of the sequential ordinal paths as the selected path for propagating an input signal received at the input of the first delay stage of the selected path to the output of the second delay stage of the selected path. Other embodiments of this aspect include corresponding systems, apparatus, and computer programs, configured to perform the actions of the methods, encoded on computer storage devices.

Another innovative aspect of the subject matter described in this specification can be embodied in methods that include the actions of determining first control data for a plurality of delay stages arranged in a first lattice, wherein: each delay stage is operable to receive a signal as input and generate a delayed instance of the signal as output; the plurality of delay stages are connected to each other in the first lattice to define a plurality of sequential ordinal paths, and each sequential ordinal path comprises a unique proper subset of the plurality of delay stages; each sequential ordinal path subsequent to a prior sequential ordinal path includes in its unique proper subset of delay stages at least a delay stage from each prior ordinal path; each sequential ordinal path comprises a plurality of delay stages; and each sequential ordinal path begins at a first delay stage with an input connected to the first signal input node and ends at a second delay stage with an output connected to the first signal output node. The first control data defines a selected path and causes each delay stage to selectively activate or deactivate to select one of the sequential ordinal paths as the selected path for propagating an input signal received at the input of the first delay stage of the selected path to the output of the second delay stage of the selected path. The method also includes applying the first control data to the plurality of delay stages; and applying an input signal to the first signal input node to generate a delayed instance of the input signal at the first signal output node.

Other embodiments of this aspect include corresponding systems, apparatus, and computer programs, configured to perform the actions of the methods, encoded on computer storage devices.

Particular embodiments of the subject matter described in this specification can be implemented so as to realize one or more of the following advantages. Because the DCO does not require a channel selector in the feedback loop, such as a multiplexor, the oscillator has a higher programmable frequency range over those that do require a channel selector. This also has the benefit of lower jitter for a given operating point.

The higher tuning range compared to other devices allows for more frequency coverage and a broader lock range. Moreover, the need for trimming and fusing with automated test equipment is also obviated. Additionally, the design is highly scalable and can be implemented without complex control circuits. The lattice design, in some implementations, results in each stage of the oscillator being loaded by two other stages. As a result, all stages in a given voltage threshold section contribute the same overall delay to the loop, which produces a roughly uniform step size per digital code. The lattice design allows for streamlined routing, resulting in lower routing parasitics than other oscillator designs. In addition to giving a larger tuning range than other oscillator designs that include a switching device, e.g., a multiplexor, in the feedback loop, the lattice also yields a more linear frequency-vs.-code tuning curve, which simplifies modeling and programming the oscillator.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 5 is a diagram illustrating programmable sensitivities to VDD based on the delay stage selections of the tunable DCO of FIG. 4.

FIG. 6 is a diagram illustrating DCO periods and tuning based on path selection and tuning.

FIG. 7A is a diagram illustrating another example implementation of a tunable DCO with multiple sensitivity stages.

FIG. 7B is a diagram illustrating programmable sensitivities to VDD based on the delay stage selection and sensitively stage selection of the tunable DCO of FIG. 7A.

Like reference numbers and designations in the various drawings indicate like elements.

DETAILED DESCRIPTION

Figure 1A:
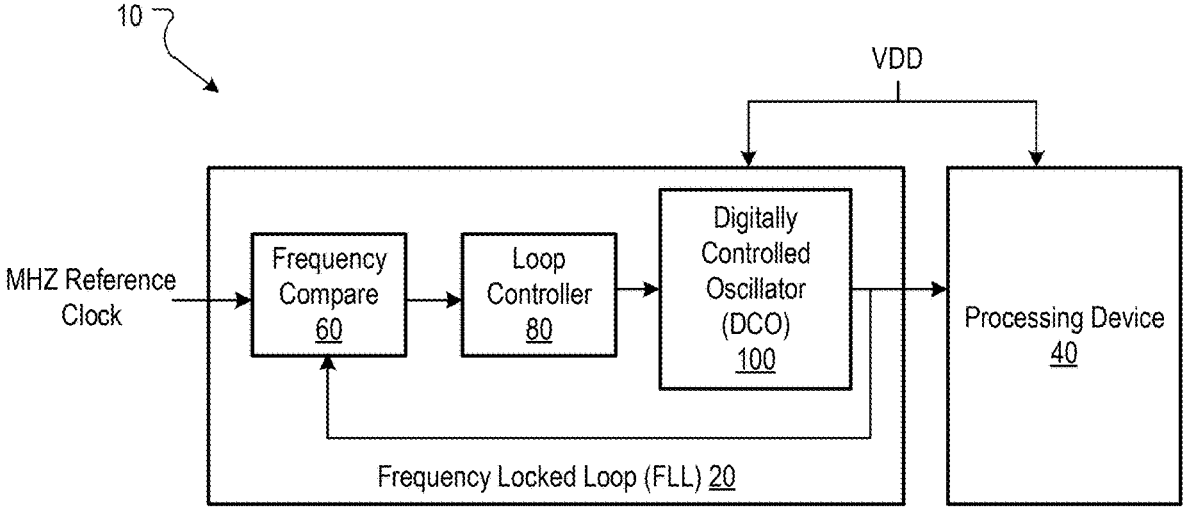
FIG. 1A is a block diagram of a processing system that includes a frequency locked loop (FLL).

FIG. 1A is a block diagram of a processing system 10 that includes a frequency locked loop (FLL) 20. The FLL 20 generates a clock signal for a processing device 40, and both the processing device 40 and the FLL share a common supply VDD.

The FLL 20 receives a reference clock at a frequency compare block 60. The frequency compare block 60 generates an error signal for a loop controller 80, and the loop controller 80 processes the error signal to generate control signals to adjust the DCO 100 clock frequency. The DCO 100 clock frequency is also provided to the frequency compare block 60 for generating the error signal.

In the processing device 40, there are critical processing paths that have inherent delays. Such delays may be gate dominated delays and routing dominant delays. When a large L*di/dt event occurs, transients appear on the supply voltage VDD. Because the component delays in the critical path are sensitive to supply voltage VDD changes, the delays may increase when the supply voltage droops. As long as the critical path delays are less than the processing device clock period, however, the processing device 40 will not be impacted by the L*di/dt event.

When using a PLL to generate a clock signal, the supply voltage VDD must have a margin to accommodate for the L*di/dt events. This results in wasted power, as the L*di/dt events occur for only a small percentage of the operational time.

The FLL 20 can be used instead of a PLL to reduce the requirement of this voltage margin for VDD. Because the DCO 100 of the FLL 20 is powered by the same voltage supply VDD as the processing device 40, and because the delays of the DCO 100 have similar voltage sensitivities as the devices in the processing device 40, the DCO 100 naturally and quickly adjusts its frequency based on the voltage VDD. This adjustment occurs within the DCO 100 itself, and not from the feedback control loop of the FLL 20. In general, the control loop of the FLL 20 is not fast enough to adjust for L*di/dt events.

Figure 1B:
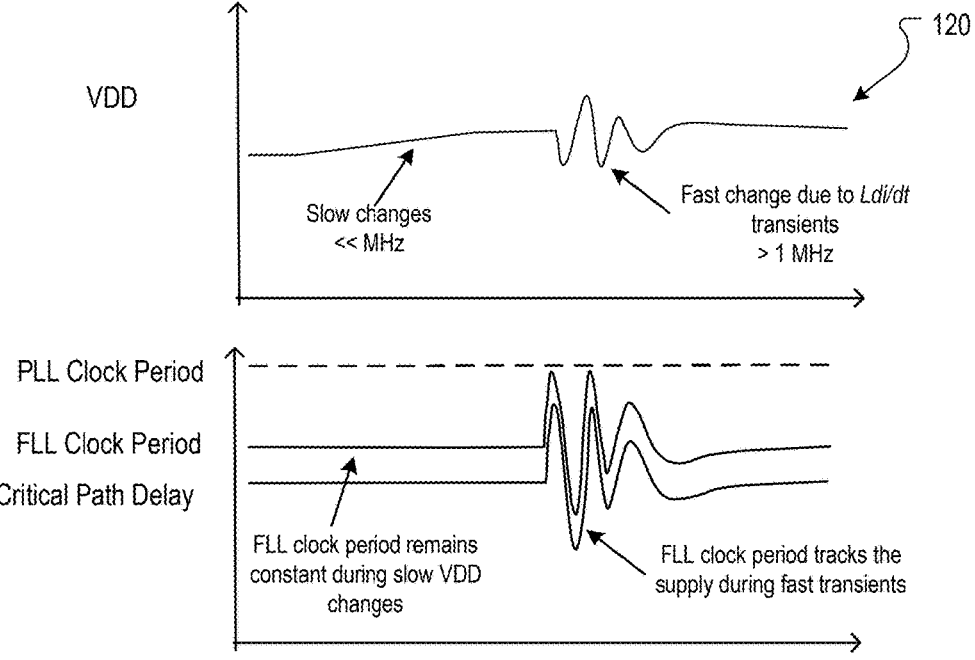
FIG. 1B is a timing diagram illustrating the impact of an L*di/dt on the FLL clock period.

This phenomenon is shown in FIG. 1B, which is a timing diagram 120 illustrating the impact of an L*di/dt event on the FLL clock period. While the control loop of the FLL 20 is too slow to react to the L*di/dt event, the DCO 100 naturally adjusts to the VDD voltage. This allows the FLL 20 output clock frequency to change in a similar way to the critical path delays. Thus, the VDD margin that would otherwise be required for the constant PLL clock can be reduced.

However, to achieve the desired response illustrated in FIG. 1B, the DCO 100 of the FLL 20 should have a response that closely tracks the response of the critical paths in the processing device 40. This is illustrated in FIG. 1C, which is a diagram 140 illustrating various DCO periods in response to an L*di/dt event.

Figure 1C:
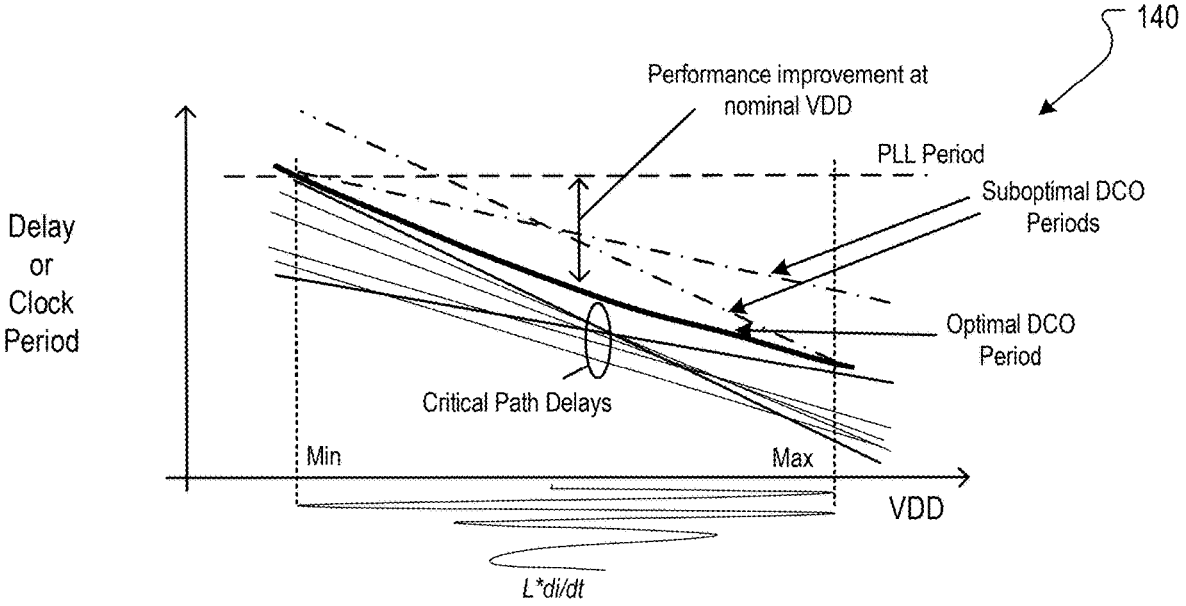
FIG. 1C is a diagram illustrating various DCO periods in response to an L*di/dt event.

In FIG. 1C, the voltage VDD on the lower axis ranges between a maximum and minimum value in response to an L*di/dt event. The critical path delays of the processing device 40, which are represented by the lines passing through the lasso label, likewise increase or decrease accordingly.

To ensure the FLL 20 response maintains timing margins during the L*di/dt event, the DCO 100 need not match any particular critical path. Instead, the DCO 100 period need just be greater than the delay of all the critical paths over the VDD range during the L*di/dt event. This is shown by the Optimal DCO Period response line in bold in FIG. 1C. The improvement over the PLL system is illustrated by the delay overhead between the Optimal DCO Period response and the flat PLL Period line. This improvement enables the running of the processing device 40 at either a higher speed or a lower supply voltage VDD.

The optimal DCO period response will depend on the critical path delays of the particular processing device 40 used. A DCO period response that is either too sensitive to VDD variations or too insensitive to VDD variations for a particular processing device 40 will result in a suboptimal DCO Period response, as illustrated by the two additional DCO period responses of in FIG. 1C.

Figures 2, 3:
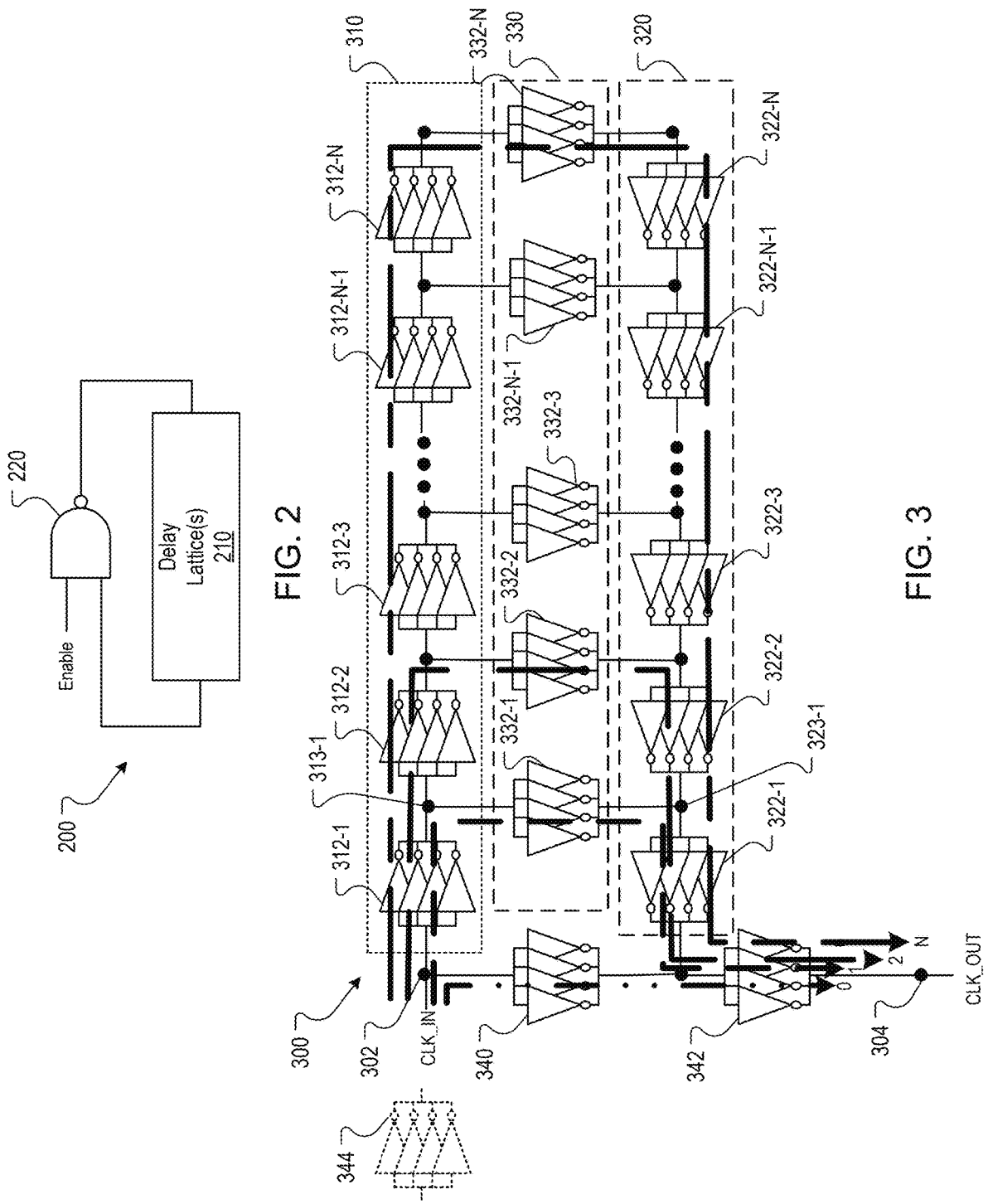
FIG. 2 is a block diagram of a tunable DCO.
FIG. 3 is a circuit diagram of an example delay lattice for the tunable DCO.

FIG. 2 is a block diagram of a tunable DCO 200, which is tunable to achieve different DCO responses. The particular response so tuned will depend on the characteristics of the particular processing device 40 for which the FLL 20 that uses the DCO 200 provides a clock signal.

The DCO 200 includes one or more delay lattices 210 and a feedback circuit 220. In this example, the feedback circuit 220 is a two-input NAND gate, with a first input coupled to an output node of the delay lattices 201, and a second input coupled to an enable signal. The output of the NAND gate is coupled to an input node of the delay lattice 210, forming an oscillator.

FIG. 3 is a circuit diagram of an example implementation delay lattice 300 for the tunable DCO 200. The delay lattice 300 includes a signal input node 302 and a signal output node 304. In this implementation, the signal on the output node 304 is a clock output signal, and the signal on the input node 302 is the output of the feedback circuit 220.

The delay stages 312, 322, 332, 340 and 342, in this example, each a parallel arrangement of tri-state inverters. Each delay stage is operable to receive a signal as input and generate a delayed instance of the signal as output. In the case of a tri-state inverter, the delayed instance output by each inverter is inverted from its input. The delay through a particular delay stage is determined by the number of tri-state inverters enabled at a given time. As the number of enabled tri-state inverters increase, the delay in the stage will decrease, and as the number of enabled tri-state inverters decrease, the delay in the stage will increase. The particular number of tri-state inverters in a stage can be two or more.

Other devices to realize an adjustable delay stage can also be used, including logic gate delays and programmable delays. Additionally, non-inverting delay stages can be used. Non-inverting stages tend to have higher delay than inverting stages, and thus the number of stages can be adjusted to achieve a same frequency. More series stages (e.g., higher path number) for the same frequency also allows more/ smaller steps for tuning.

The delay stages 312, 322, 334, 340 and 342 are arranged in a lattice and connected to each other in the lattice to define a set of sequential ordinal paths 1 . . . N. Each sequential ordinal path comprises a unique proper subset of the delay stages. For example, ordinal path 1, as indicated by the bold trace with the arrow terminating with the numeral 1, has the unique proper subset of delay stages 312-1, 332-1, and 322-1, and 342.

Additionally, each sequential ordinal path subsequent to a prior sequential ordinal path includes in its unique proper subset of delay stages at least a delay stage from each prior ordinal path. For example, ordinal path 2 includes delay stages 312-1, 312-2, 332-2, 322-2, 322-1, and 342, and thus includes delay stages 312-1, 322-1, and 342 from ordinal path 1.

Finally, each sequential ordinal path begins at a first delay stage with an input connected to the signal input node 302, e.g., delay stage 312-1 with its input connected to node 302 and ends at a second delay stage with an output connected to the signal output node 304, e.g., delay stage 342 with its output connected to node 304.

The delay stage 342 is an optional delay stage and need not be included in the lattice 300. If the delay stage 342 is omitted, then the output node will be the output of delay stage 322-1.

The maximum possible delay of an ordinal path increases according to its ordinal position in the sequence. For example, the maximum delay of ordinal path 1 will be 4T, where T is a maximum delay of each of the delay stages 312-1, 332-1, and 322-1, and 342. Likewise, for path 2, the maximum delay will be 6T, and so on.

In some implementations, the time delay range of the particular paths will partially overlap. For example, the delay of path 2 can be less than the maximum delay of path 1, i.e., less than 4T, depending on the individual delay adjustments for each delay stage in path 2.

The delay stages are operable to receive control data defining a selected ordinal path. As will be described in more detail below, there is control data that can select an ordinal path, and additional control data that can adjust the delay of each delay stage in the selected path. In some implementations, the control data to select an ordinal path does not change during device operation. This control data may be persisted to a read only memory, or, alternatively, may be generated during a start-up diagnostic process. In the case of the former, the control data to select an ordinal path may be part of a design for a particular hardware device.

In the case of the latter, the diagnostic process may be run at start-up. During the diagnostic process, the process discovers a path that provides a frequency within some target range. In implementations that include lattices with different voltage sensitives (described with reference to FIG. 4 below), the process may search paths limited to path values that provide the target VDD voltage sensitivity. For example, a voltage sensitivity may be specified for a particular compute core and may correspond to having an equal number of high voltage threshold stages and low voltage threshold stages in the loop. The diagnostic will thus, for example, check paths (1,1), (2,2) and (3,3) to find the one that gives the appropriate frequency. Each of these will have the same voltage sensitivity but a different frequency range.

In another implementation, the diagnostic mode can create processing demands that create L*di/dt events to cause VDD variations. The system then checks for system processing errors due to read errors, e.g., due to loss of the data eye. An appropriate path that minimizes the errors is then selected for the DCO 200, and the corresponding control data are generated. The control data causes each delay stage to selectively activate or deactivate to select one of the sequential ordinal paths as the selected path for propagating an input signal received at the input of the first delay stage of the selected path to the output of the last delay stage of the selected path. For example, to select path 2, the system, e.g., the loop controller 80 or some other process, generates data that enables the delay stages 312-1, 312-2, 332-2, 322-2, 322-1, and 342, and disables the remaining delay stages in the lattice 300.

Other appropriate diagnostic processes can also be used.

In some implementations, the lattice 300 includes an initial ordinal path, which is shown as path 0. The initial ordinal path is prior to each of the sequential ordinal paths, and thus has the lowest possible delay. The initial ordinal path begins at a delay stage with an input connected to the signal input node 302. In FIG. 3, the delay stage 340 is at the beginning of the original path 0.

In the event that the delay stage 342 is omitted, then the initial ordinal path is simply the delay stage 340. In some implementations, an initial delay stage 344 (shown in phantom) can be included in the lattice when the delay stage 342 is omitted. The initial delay stage 344 has an output connected to the input node 302.

If the initial path is included in the lattice, then the control data can further define the initial ordinal path as the selected path. This is done by causing each delay stage in the lattice 300 to selectively activate or deactivate to select the initial path as the selected path.

In the example implementation of FIG. 3, the lattice 300 is arranged in rows and columns. In particular, the lattice 300 is a lattice of two rows 310 and 320 and N columns 330 of delay stages. The first row 310 is a set of series connected delay stages 312, i.e., the output of delay stage 312-1 is connected to the input of delay stage 312-2, and so on. Each delay stage is an element in the row 310. Likewise, the second row 320 is also set of series connected delay stages 322 and is separate from the first row 310. Each delay stage 322 is an element in the row 320.

Each column of the N columns 330 is at least one delay stage 332, and each delay stage 332 is an element of a respective column. For each column, an input of a delay stage of the column is connected to a node that is also connected to an output of a delay stage in the first row 310 and an input of a delay stage in the first row 310. For example, the input of the delay stage 332-1 is connected to the node 313-1, which is a node connected to the output of the delay stage 312-1 and the input of the delay stage 312-2. Likewise, an output of the delay stage of the column is connected to i) a node that is also connected to an output of a delay stage in the second row and ii) an input of a delay stage in the second row. For example, the output of the delay stage 332-1 is connected to the node 323-1, which is a node connected to the output of the delay stage 322-2 and the input of delay stage 322-1.

While the lattice 300 shows only one delay stage between each node, in other implementations, multiple delay stages can be connected between particular nodes. For example, each of the N columns may be two or more series connected delay stages. Likewise, a column need not be between each delay stage in a row; instead, a column may occur for each two series connected delay stages.

The lattice 300 can be used in conjunction with a feedback circuit to realize a tunable DCO. Because the lattice 300 does not require an output channel selector, such as a multiplexor, the delay of such selection devices is not introduced into the DCO. Thus, the DCO has a larger tuning range than a DCO that uses selection channels in the feedback loop to generate a clock signal.

To achieve the various DCO responses described with reference to FIG. 1C, in some implementations, lattices can be cascaded, where each lattice is made of components with voltage sensitivities unique for that lattice. This enables the tunable voltage sensitivity of FIG. 1C.

Figure 4:
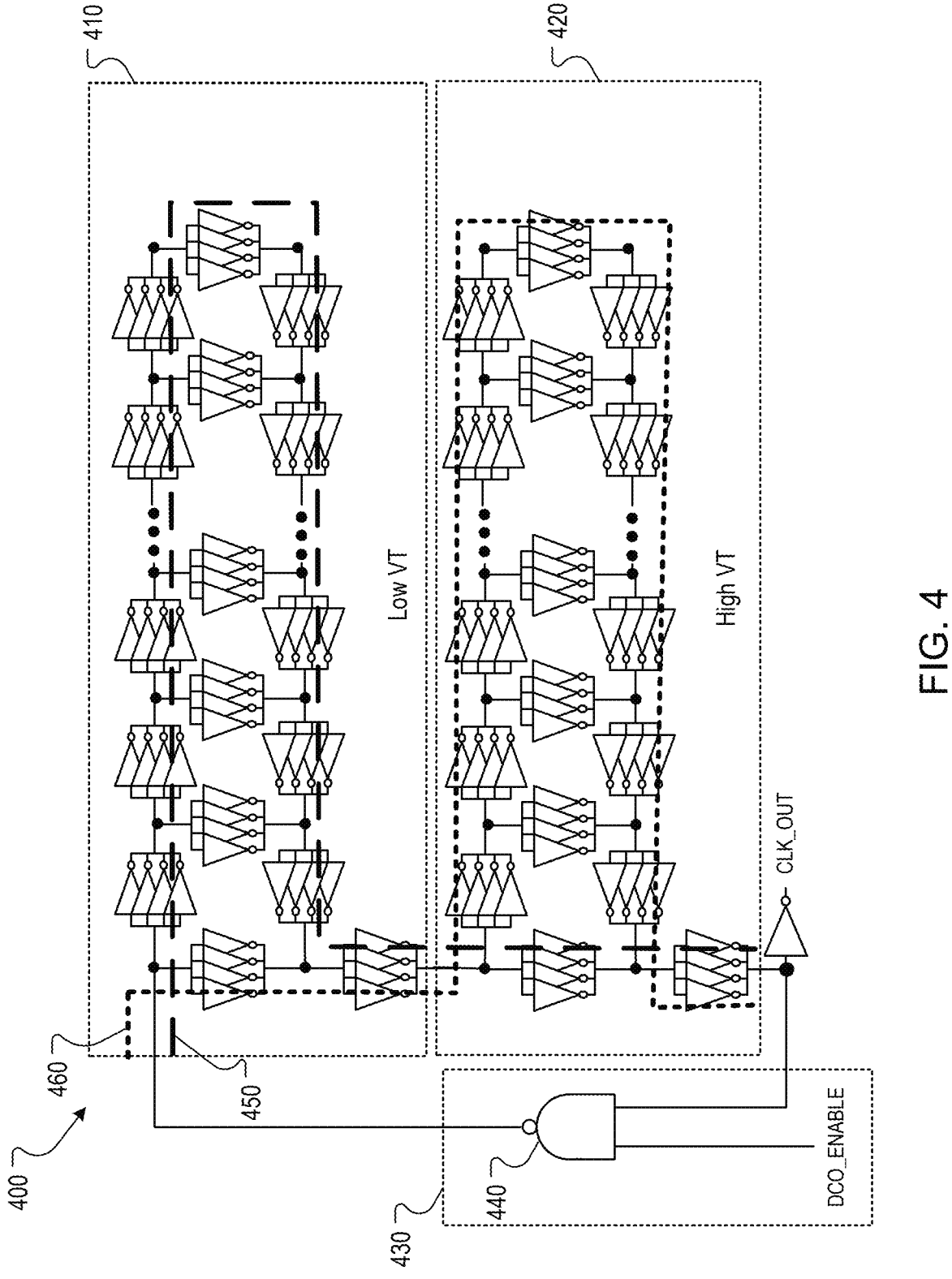
FIG. 4 is a circuit diagram of an example implementation of the tunable DCO that has programmable voltage sensitivity.

FIG. 4 is a circuit diagram of an example implementation of the tunable DCO 400 that has programmable voltage sensitivity. The operation of each lattice 410 and 420 is the same as the operation of the lattice 300 of FIG. 3. The lattices 410 and 420 are cascaded so that the signal output of the lattice 410 is provided as the signal input of the lattice 420. The output clock signal is then provided to the feedback circuit 430, e.g., NAND gate 440, and the output of the feedback circuit 430 is provided as the input to the lattice 410 to form the DCO 400.

The delay stages in the lattice 410 are of a different voltage threshold than the delay stages in the lattice 420. For example, the delay stages in the lattice 410 may be of a lower voltage threshold than the delay stages in the lattice 420. Depending on the paths selected through the lattices 410 and 420, the DCO period response sensitivity to VDD changes will vary. Moreover, different overall paths may be selected through the lattices 410 and 420 such that the DCO delay for each overall path is the same, but the sensitivity to VDD changes are different. This is shown in FIG. 5, which is a diagram illustrating programmable sensitivities to VDD based on the delay stage selections of the tunable DCO 400 of FIG. 4.

As illustrated in FIG. 5, as the number of delay stages that have low voltage sensitivity increase and the number of delay stages that have high voltage sensitives decrease, the DCO period response tends to flatten with respect to VDD variations. In FIG. 4, for example, the path 450 would result in the DCO having a flattest response to VDD changes.

Conversely, as the number of delay stages that have low voltage sensitivity decrease and the number of delay stages that have high voltage sensitives increase, the DCO period response tends to increase with respect to VDD variations. In FIG. 4, for example, the path 460 would result in the DCO having the highest response to VDD changes.

DCO sensitivity is one programmable parameter of the DCO. The other programmable parameter is the period, and, in particular, a given path for the period. This is shown in FIG. 6, which is diagram 600 illustrating DCO periods and tuning based on path selection and tuning. Each numbered path 0-5 corresponds to an ordinal path through the DCO lattice(s). The overall path delay of the ordinal path sets the DCO center frequency. The longer the path, the greater the delay, and thus the DCO will oscillate at a lower frequency than if a shorter path were selected.

The particular path selected will depend on the desired center frequency. For example, in FIG. 6, the desired center frequency f can be realized by each of the paths 0-5. However, the optimal path is path 3, as this allows for the greatest range of tuning by the FLL 20. Accordingly, control data to enable path 3 and disable other paths is generated. Such control data may include, for example, data for each delay in the lattice(s) that enables or disables the lattice. The control data is generated, for example, based on address data for each delay in the lattice(s).

In particular, once a path through the lattice(s) is selected, which is referred to as a coarse tuning, then the individual delay stages in the path can be adjusted as necessary to maintain a desired frequency. The adjustment of individual delay stages is referred to as fine tuning and is done by the feedback control loop. As shown in FIG. 6, the adjustment of the delay stages in path 3 will result in the DCO frequency shifting up or down path 3, as indicated by the directional arrow 602. The feedback control loop of the FLL 20 generates second control data to adjust the delays of the enabled path as necessary.

FIG. 7A is a diagram illustrating another example implementation of a tunable DCO 700 with multiple sensitivity stages 702, 704 and 706. Each stage 702, 704, and 706 is similar to the implementation of FIG. 4, except that each stage 702, 704 and 706 has a combination of voltage threshold devices that is different from each other stage. For example, stage 702 has two lattices, one of high voltage threshold devices, and one of mid voltage threshold devices. Likewise, stage 704 has two lattices, both of mid voltage threshold devices. Finally, stage 706 has two lattices, one of mid voltage threshold devices, and one of low voltage threshold devices.

The implementation of FIG. 7A allows for a wide range of sensitivities, as illustrated in FIG. 7B, which is a diagram 720 illustrating programmable sensitivities to VDD based on the delay stage selections and sensitively stage selection of the tunable DCO of FIG. 7A. The corresponding sensitivity responses of the stages 702, 704 and 706 are indicated by matching response curve patterns.

Once tuned to a proper DCO response curve, the DCO 700 output is selected by the multiplexor 710. For example, assume the DCO response curve desired is a Mid-Mid curve. In this case, the multiplexor 710 selects the output of stage 704 and provides the selected output as the DCO clock. Because the multiplexor 710 is not in the feedback loop, the time delay of the multiplexor 710 does not impact the DCO. Thus, the DCO 700 realizes a wider tuning range than if a multiplexor were the DCO feedback loop.

Figure 8:
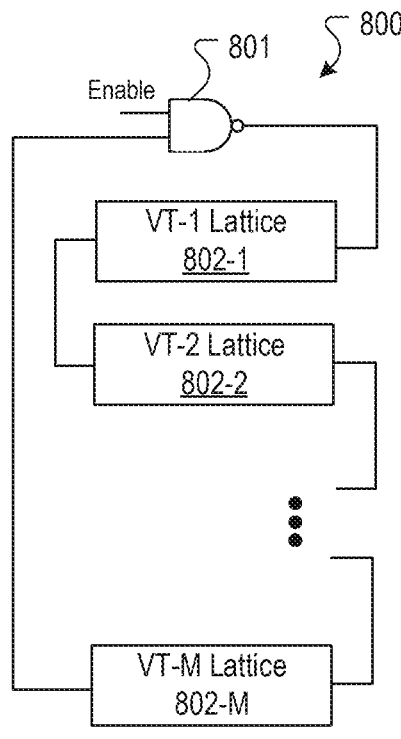
FIG. 8 is a diagram illustrating another example implementation of a tunable DCO with multiple, cascaded lattices.

While the example implementations described above use one or two lattices, additional lattices can also be used. FIG. 8 is a diagram illustrating another example implementation of a tunable DCO 800 with multiple, cascaded lattices 802-1 . . . 802-M. The lattices 802 have a structure and operate in a manner similar to the lattices described with reference to FIGS. 3 and 4 above. The input of lattice 802-1 is connected to the output of the NAND gate 801, and the output of the lattice 802-1 is connected to the input of the lattice 802-2, and so on, until the lattice 802-M, which has its output connected to an input of the NAND gage 801.

In some implementations, each lattice 802 has a voltage sensitivity that is different from the voltage sensitivity of each other lattice 802. For example, lattice 802-1 may have a voltage sensitivity of VT-1, lattice 802-2 may have a voltage sensitivity of VT-2, and so on through the final lattice 802-M, which may have a voltage sensitivity of VT-M. Each of the voltage sensitivities VT-1 . . . VT-M are different from each other.

In other implementations, some of the voltage sensitivities can be the same. For example, VT-1 and VT-2 may be equal to each other, but different from all other sensitivities. Likewise, VT-3 and VT-4 may be equal to each other, but different from all other sensitivities, and so on, through VT-M-1 and VT-M.

Figure 9:
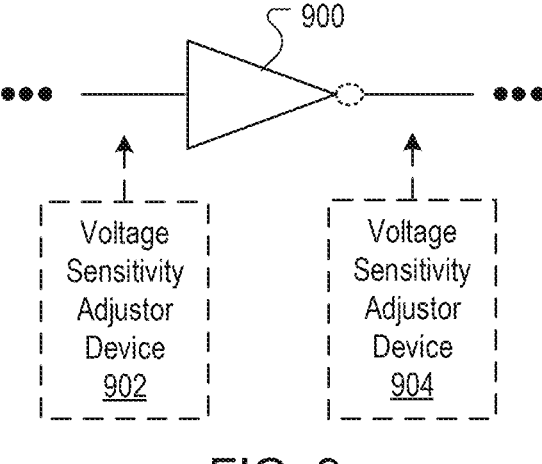
FIG. 9 is a diagram illustrating another implementation in which a delay stage may have its voltage sensitivity adjusted by one or more voltage sensitivity adjustor devices.

In some implementations, the lattices may be made of delays that all have the same sensitivity, but the sensitivities can be adjusted by one or more voltage sensitivity adjustor devices. FIG. 9 is a diagram illustrating another implementation in which a delay stage 900 may have its voltage sensitivity adjusted by one or more voltage sensitivity adjustor devices 902 and 904. Example voltage sensitivity adjustor devices 902 and 904 include resistors and varactors. In the case of a resistor, the resistor can be placed in series with either the input or the output of the delay 900. In the case of a varactor, the varactor may be connected between the input of the delay 900 and another node, e.g., ground, or the output of the delay 900 and another node, e.g., ground.

To simplify control schemes, each delay 900 in a lattice may be configured in the same way, i.e., each will have the same configuration of a voltage sensitive adjustor. However, such configuration is optional, and it is not necessary for all delays 900 to be configured the same, so long as the individual delay sensitivities are accounted for in the control logic.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC.

Processors suitable for the execution of a computer program include, by way of example, both general and special purpose microprocessors, and any one or more processors of any kind of digital computer. Generally, a processor will receive instructions and data from a read-only memory or a random-access memory or both. The essential elements of a computer are a processor for performing actions in accordance with instructions and one or more memory devices for storing instructions and data. Devices suitable for storing computer program instructions and data include all forms of non-volatile memory, media and memory devices, including by way of example semiconductor memory devices. The processor and the memory can be supplemented by, or incorporated in, special purpose logic circuitry.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A apparatus, comprising:
a first signal input node;
a first signal output node; and
a plurality of delay stages arranged in a first lattice, each delay stage operable to receive a signal as input and generate a delayed instance of the signal as output, wherein:
    the plurality of delay stages are connected to each other in the first lattice to define a plurality of sequential ordinal paths, and each sequential ordinal path comprises a unique proper subset of the plurality of delay stages;
    each sequential ordinal path subsequent to a prior sequential ordinal path includes in its unique proper subset of delay stages at least a delay stage from each prior ordinal path;
    each sequential ordinal path comprises a plurality of delay stages; and
    each sequential ordinal path begins at a first delay stage with an input connected to the first signal input node and ends at a second delay stage with an output connected to the first signal output node; and
wherein the plurality of delay stages is operable to receive first control data defining a selected path and the control data causes each delay stage to selectively activate or deactivate to select one of the sequential ordinal paths as the selected path for propagating an input signal received at the input of the first delay stage of the selected path to the output of the second delay stage of the selected path;
wherein the first lattice comprises a lattice of two rows and N columns of delay stages, wherein:
    a first row of the two rows comprise series connected delay stages;
    a second row of the two rows comprise series connected delay stages, wherein the second row is separate from the first row; and
    each column of the N columns comprises at least one delay stage, and wherein an input of a delay stage of the column is connected to a node that is also connected to i) an output of a delay stage in the first row and ii) an input of a delay stage in the first row, and an output of the delay stage of the column is connected to i) a node that is also connected to an output of a delay stage in the second row and ii) an input of a delay stage in the second row; and
each delay stage comprises a plurality of delay elements that may be individually enabled, and for each delay stage a delay for the stage is proportional to a number of the plurality of delay elements are enabled; and
each delay stage is operable to receive second control data defining delay stage adjustments for each delay stage in a selected path to adjust an overall time delay for propagating an input signal received at the first delay stage to the output of the second delay stage.

2. The apparatus of claim 1, wherein:
the plurality of delay stages are further connected to each other in the first lattice to define an initial ordinal path that is prior to each of the sequential ordinal paths;

the initial ordinal path begins at a third delay with an input connected to the first signal input node, and the third delay stage is different from the first delay stage;
the first control data can further define the initial ordinal path as the selected path and the control data causes each delay stage to selectively activate or deactivate to select the selected path for propagating an input signal received at the third delay stage.

3. The apparatus of claim 2, wherein the initial ordinal path ends at the second delay stage with the output connected to the first signal output node.

4. The apparatus of claim 2, wherein the initial ordinal path ends at an output of the third delay stage with the output of the third delay stage connected to the first signal output node.

5. The apparatus of claim 1, further comprising:
a feedback circuit that receives the delayed instance of the input signal output at the first signal output node and, in response, generates an input signal that is applied to the first signal input node.

6. The apparatus of claim 5, wherein the feedback circuit comprises a two-input NAND gate, a first input coupled to the first signal output node, and a second input coupled to an enable signal, and an output coupled to the first signal input node.

7. The apparatus of claim 1, further comprising:
a second signal input node;
a second signal output node; and
a plurality of delay stages arranged in a second lattice, each delay stage operable to receive a signal as input and generate a delayed instance of the signal as output, wherein:
    the plurality of delay stages are connected to each other in the second lattice to define a plurality of sequential ordinal paths, and each sequential ordinal path comprises a unique proper subset of the plurality of delay stages;
    each sequential ordinal path subsequent to a prior sequential ordinal path includes in its unique proper subset of delay stages at least a delay stage from each prior ordinal path;
    each sequential ordinal path comprises a plurality of delay stages; and
    each sequential ordinal path begins at a fourth delay stage with an input connected to the second signal input node and ends at a fifth delay stage with an output connected to the second signal output node; and
the plurality of delay stages is operable to receive third control data defining a selected path and the control data causes each delay stage to selectively activate or deactivate to select one of the sequential ordinal paths as the selected path for propagating an input signal received at the input of the fourth delay stage of the selected path to the output of the fifth delay stage of the selected path;
wherein:
    the first signal input node is connected to an input signal;
    the first signal output node is connected to the second signal input node; and
    the second signal output node provides an output signal of the apparatus.

8. The apparatus of claim 7, wherein the plurality of delay stages in the first lattice has a voltage sensitivity that is different from a voltage sensitivity of the plurality of delay stages in the second lattice.

9. The apparatus of claim 1, wherein each delay stage comprises a plurality of tri-state inverters connected in parallel.

10. The apparatus of claim 7, further comprising:

a feedback circuit that receives the delayed instance of the input signal output at the second signal output node and, in response, generates an input signal that is applied to the first signal input node.

11. A method implemented in an electronic device, comprising:

determining first control data for a plurality of delay stages arranged in a first lattice, wherein:

each delay stage is operable to receive a signal as input and generate a delayed instance of the signal as output;

the plurality of delay stages are connected to each other in the first lattice to define a plurality of sequential ordinal paths, and each sequential ordinal path comprises a unique proper subset of the plurality of delay stages;

each sequential ordinal path subsequent to a prior sequential ordinal path includes in its unique proper subset of delay stages at least a delay stage from each prior ordinal path;

each sequential ordinal path comprises a plurality of delay stages; and each sequential ordinal path begins at a first delay stage with an input connected to the first signal input node and ends at a second delay stage with an output connected to the first signal output node; and the first control data defines a selected path and causes each delay stage to selectively activate or deactivate to select one of the sequential ordinal paths as the selected path for propagating an input signal received at the input of the first delay stage of the selected path to the output of the second delay stage of the selected path;

applying the first control data to the plurality of delay stages; and applying an input signal to the first signal input node to generate a delayed instance of the input signal at the first signal output node;

wherein:

the first lattice comprises a lattice of two rows and N columns of delay stages, wherein:

a first row of the two rows comprise series connected delay stages;

a second row of the two rows comprise series connected delay stages, wherein the second row is separate from the first row; and each column of the N columns comprises at least one delay stage, and wherein an input of a delay stage of the column is connected to a node that is also connected to i) an output of a delay stage in the first row and ii) an input of a delay stage in the first row, and an output of the delay stage of the column is connected to i) a node that is also connected to an output of a delay stage in the second row and ii) an input of a delay stage in the second row; and each delay stage comprises a plurality of delay elements that may be individually enabled, and for each delay stage a delay for the stage is proportional to a number of the plurality of delay elements are enabled; and determining second control data defining delay stage adjustments for each delay stage in a selected path to adjust an overall time delay for propagating an input signal received at the first delay stage to the output of the second delay stage; and applying the second control data to the plurality of delay stages.

12. The method of claim 11, wherein:

the plurality of delay stages are further connected to each other in the first lattice to define an initial ordinal path that is prior to each of the sequential ordinal paths;

the initial ordinal path begins at a third delay with an input connected to the first signal input node, and the third delay stage is different from the first delay stage;

the first control data can further define the initial ordinal path as the selected path and the control data causes each delay stage to selectively activate or deactivate to select the selected path for propagating an input signal received at the third delay stage.

13. The method of claim 11, further comprising:

generating a feedback signal from the delayed instance of the input signal output at the first signal output node; and providing the feedback signal as the input signal to the first signal input node.

14. The method of claim 11, further comprising:

determining second control data to define delay stage adjustments for each delay stage in a selected path to adjust an overall time delay for propagating an input signal received at the first delay stage of the selected path to the last delay stage of the selected path; and applying the second control data to the delay stages in the selected path.

15. The method of claim 11, further comprising:

cascading a plurality of delay stages arranged in a second lattice to the plurality of delay stages arranged in the first lattice by connecting the first signal output node of the first lattice to a second signal input node of the second lattice; and determining second control data for the plurality of delay stages arranged in the second lattice, wherein the second control data defines a selected path and causes each delay stage to selectively activate or deactivate to select one of a plurality of sequential ordinal paths as the selected path for propagating the input signal received at the first delay stage of the selected path to the last delay stage of the selected path.

16. The method of claim 15, wherein the plurality of delay stages in the first lattice has a voltage sensitivity that is different from a voltage sensitivity of the plurality of delay stages in the second lattice.

17. The method of claim 15, wherein each delay stage comprises a plurality of tri-state inverters connected in parallel.

* * * * *